United States Patent [19]

Ramaprasad

[11] Patent Number: 4,675,466
[45] Date of Patent: Jun. 23, 1987

[54] STABILIZATION OF INTRACONNECTIONS AND INTERFACES

[75] Inventor: Kackadasam R. Ramaprasad, Lawrenceville, N.J.

[73] Assignee: Chronar Corp., Princeton, N.J.

[21] Appl. No.: 859,504

[22] Filed: Apr. 5, 1986

[51] Int. Cl.[4] .................. H01L 27/14; H01L 31/18
[52] U.S. Cl. ................................. 136/244; 29/572; 29/590; 357/2; 357/30; 357/59; 427/88; 427/91; 427/307; 136/258
[58] Field of Search ............... 29/572, 590; 136/244, 136/258 AM; 427/88, 91, 307; 357/2, 30, 59 C

[56] References Cited

U.S. PATENT DOCUMENTS 4,316,049 2/1982 Hanak ............................ 136/244
4,528,065 7/1985 Yamazaki ........................ 156/643

FOREIGN PATENT DOCUMENTS 58-15938 3/1983 Japan ............................ 29/590
59-225577 12/1984 Japan ............................ 29/590

Primary Examiner—Aaron Weisstuch
Attorney, Agent, or Firm—George E. Kersey

[57] ABSTRACT

Stabilization of energy sensitive semiconductive devices by forming initial electrodes which are exposed through an overlying layer of semiconductor, dipping the exposed electrodes in solutions containing specified chemicals, such as metallic ion solutions of nickel, cobalt, chromium and related metals, followed by rinsing, drying and the final deposition of an overlying electrode by metallization.

23 Claims, 12 Drawing Figures

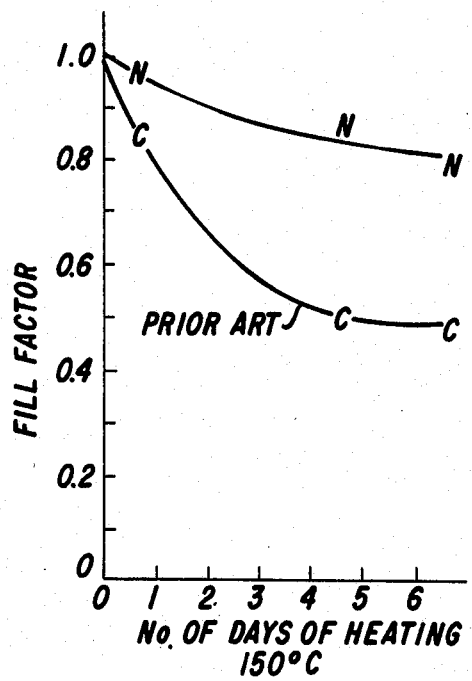
FIG. IC
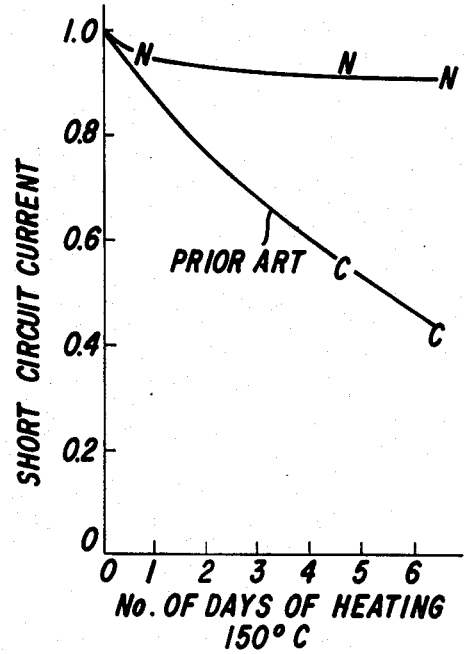
FIG. ID
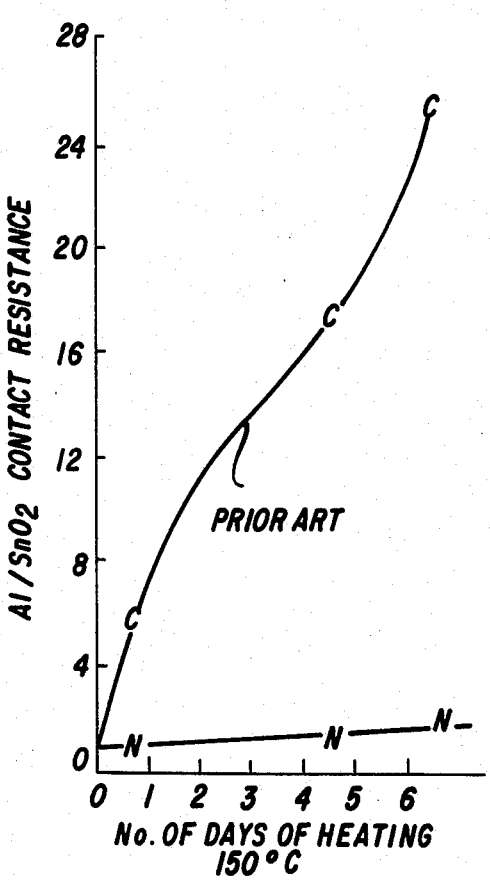
FIG. IA
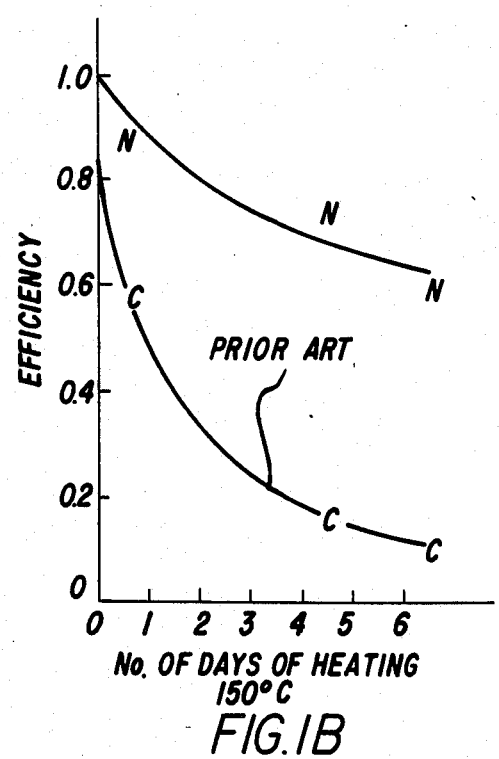
FIG. IB

STABILIZATION OF INTRACONNECTIONS AND INTERFACES

This invention relates to the stabilization of intraconnected devices, i.e., those with internal connection, and, more particularly, to the stabilization of intraconnected energy sensitive devices such as solar cells.

Energy sensitive devices such as amorphous silicon solar cells are vulnerable to various kinds of degradation that affect their performance. One important kind of degradation results in panel deterioration and arises because of thermal soaking or cycling of the electrical contact between a back electrode, usually aluminum, and a front electrode, usually conductive tin oxide in the common panel configuration of intraconnected elements of glass, tin oxide, PIN amorphous silicon, and aluminum.

A further complicating factor is the interdiffusion of silicon and aluminum at the back contact interface, namely between n-type amorphous silicon and aluminum. This type of cell degradation is continuous and non-reversible, under thermal cycling. It seriously curtails the useful lifetime of the solar panels in the field.

In the general practice of manufacturing amorphous silicon solar cells, a succession of layers are deposited, one on top of the other, on a suitable substrate. For example, glass is a commonly used substrate on which a transparent conductive tin oxide layer is deposited. Individual electrodes are created by patterning the tin oxide. This is followed by the deposition of P, I, and N types of amorphous silicon based alloys. The semiconductor layers are opened to expose a thin line of the underlying tin oxide. The final step is the deposition of the back contact, for example aluminum, to produce an intraconnected solar panel. The most common technique for the last step is vacuum metallization.

When amorphous silicon is opened to expose the underlying tin oxide, it is likely that the site thus created will not provide a good contact on subsequent metallization and subjection to thermal cycling. Further, under the same conditions of outdoor thermal cycling or soaking, there is a gradual interdiffusion between silicon and aluminum as indicated by accelerated testing.

Accordingly, it is an object of the invention to improve the stabilization of the interconnections in devices, particularly the intraconnections in solar cells.

Another object of the invention is to reduce the degradation that occurs during the thermal cycling of interconnectors, particularly solar cells.

Still another object of the invention is to reduce interdiffusion at contact interfaces, particularly in solar cells between a semiconductor and a metal contact.

SUMMARY OF THE INVENTION

In accordance with the present invention, energy sensitive panels, after first initial electrode formation but before subsequent metallizing, are dipped in solutions containing specific chemicals, followed by rinsing and drying. Then the final electrode is deposited by metallizing.

In one practice of the invention, the front electrode (conductive tin oxide) equipped panels are dipped in an acid solution, such as 30% phosphoric, for a prescribed period, such as about 30 seconds, rinsed in deionized water, and then dipped in a metallic ion solution. The metallic ion solution is desirably of nickel, cobalt, chromium, and related metals. A suitable metallic ion solution is of nickel sulfate, boric acid, and ammonium chloride. The time for metal ion treatment is prescribed, e.g., 30 seconds, and the treated panels are then rinsed in deionized water, dried with another rinse, for example isopropanol, and then subjected to back electrode deposition. It is advantageous for at least one of the solutions to include a surfactant, such as sodium lauryl sulfate, promote contact between the surface and the ions.

Lower or higher metal ion concentrations are suitable. For low concentrations, (2% nickel ion) a longer dipping time might be required. For higher concentrations, i.e., about 11% nickel ion and 1.5% each of boric acid and ammonium chloride, there is a reduction in cost effectiveness for the manufacturing process.

BRIEF DESCRIPTION OF THE DRAWINGS

Other aspects of the invention will become apparent after considering several illustrative embodiments, taken in conjunction with the drawings in which:

FIGS. 1A through 1D are graphs comparing untreated panels with those in accordance with the invention for various normalized photovoltaic factors over prescribed periods of thermal cycling;

DETAILED DESCRIPTION

Figure 2C:
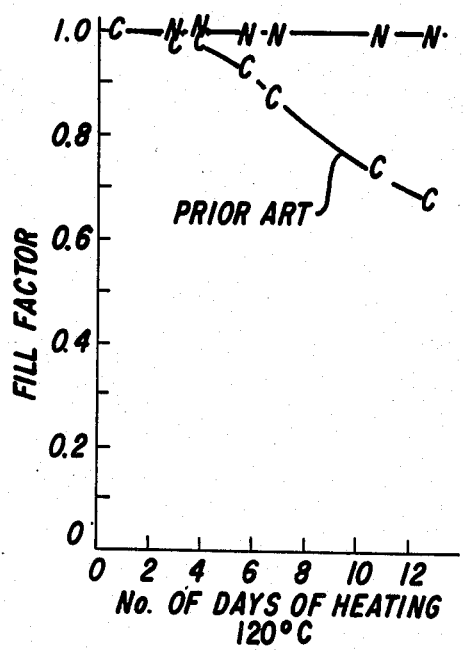
FIGS. 2A and 2B are graphs showing the effect on various normalized parameters of untreated panels in comparison with panels that have been treated in accordance with the invention.

With reference to the drawings, FIG. 1A illustrates the effect of thermal cycling on contact resistance for untreated panels and those treated in accordance with the invention.

In FIG. 1A the untreated panels ("control") are represented by various test positions designated by "C". It is seen that after six days of thermal cycling at 150° Centigrade, the contact resistance of the interconnect for a standard panel rose by a factor of 22. In the case of panels that are treated with a preliminary acid solution followed by dipping in a metallic ion solution, in accordance with the invention, after six days of thermal cycling at 150° Centigrade, the contact resistance had increased by a factor of only 1.8. This represents a significant improvement by comparison with the substantial increase in contact resistance that characterized the untreated panels.

Similarly, in the case of efficiency (percentage of light converted to electrical power) of the untreated panels versus the treated panels, the untreated panel, again with test points represented by "C", showed a reduction in efficiency by a factor of 10 after six days of thermal cycling at 150° Centigrade (FIG. 1B). By contrast, the panels treated in accordance with the invention, with test points indicated by "N" showed a reduction in efficiency by a factor of only 1.6. Here again there is a significant improvement in stabilizing the efficiency. It will be appreciated that the thermal cycling tests conducted at 150° Centigrade represent significantly accelerated aging and although practiced over a period of six days correspond to actual environmental exposure to a substantially increased period of time on the order of a number of years.

In a further example of the advantage provided by the invention, FIG. 1C compares fill factor of the treated and untreated panels. It is apparent from FIG. 1C that the untreated panels ("C") sustained a reduction in fill factor by 50% whereas the treated panels ("N") have reduction in fill factor of 20%. A further example of the invention is illustrated in FIG. 1D, where the untreated panel ("C") sustained a reduction in short circuit current of 55% after six days of thermal cycling. By contrast, treated panels ("N") sustained a reduction in short circuit current of about 10% after six days of thermal cycling at elevated temperatures (150° C.).

In another example of thermal cycling of treated and untreated panels, two solar panels with individual cell structures formed by layers of glass, tin oxide, PIN amorphous silicon, and aluminum were heated at 150° Centigrade for 22 hours. Upon subjecting the two panels, one the control and the other stabilized in accordance with the invention, to scanning Auger analysis it was found that silicon could be detected through the aluminum grain boundary of the control panel. By contrast, silicon was detected only to a distance of about 750 angstroms form the aluminum-amorphous silicon interface of the stabilized panel. This AES (Auger) depth profile was not corrected for the interface broadening effects of the sputter profiling technique. Accordingly, the actual aluminum-silicon interface is narrower than indicated by the above analysis. The same type of analysis performed in separate experiments also revealed that nickel is adsorbed by both the tin oxide surface and the amorphous silicon surface.

This is a clear indication of the capability of the present invention to retard also the interdiffusion of aluminum and silicon at the interface between a metallic electrode and a layer of silicon.

Figure 2D:
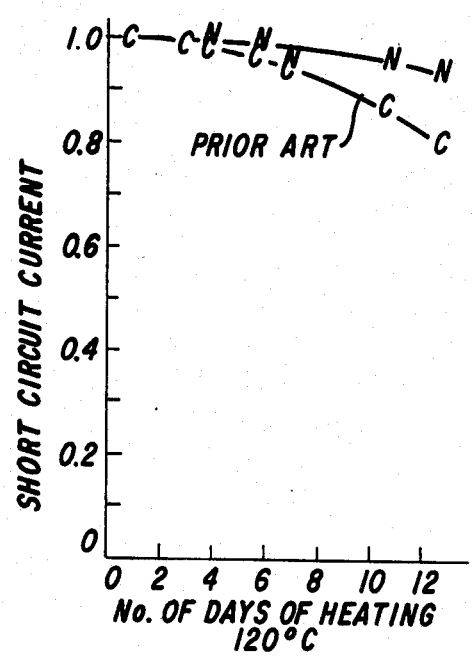
Figure 2A:
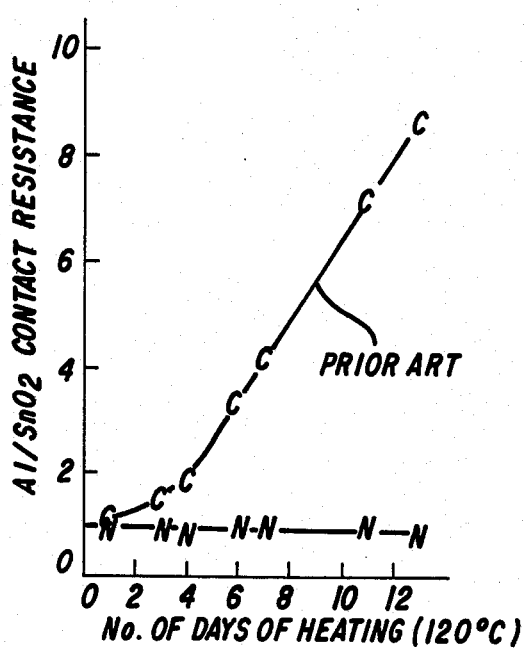

A further illustration of the advantages of the present invention is provided by the test results summarized in FIGS. 2A through 2D. For the graphs of these figures, a control and treated solar panel were heated at 120° Centigrade and the photovoltaic parameters of the panels were measured as a function of time. As indicated in FIG. 2A the contact resistance (between Al & $SnO_2$) of the control panel (indicated with "C" test points) increased by a factor of 8.5 after 300 hours at 120° Centigrade.

Figure 2B:
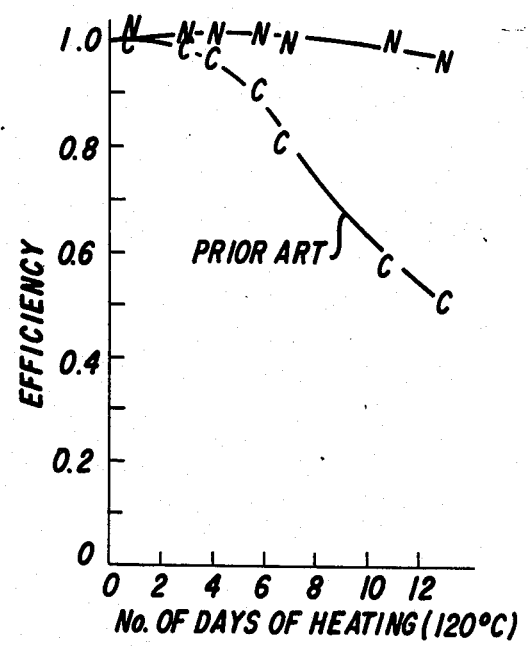

However, the panel, treated according to the present invention, showed hardly any change in the Al/$SnO_2$ contact resistance after thermal cycling at 120° C. for the same period (300 hrs.). These are indicated by points "N" in FIG. 2A. Similar stabilizing effects of the method of the present invention on other photovoltaic parameters after heating for 300 hours at 120° C. are depicted in FIGS. 2B–D.

It has been theorized that the acid dip which is the initial step in the practice of the process has a cleansing effect on the panels and prepares the panels for the metallic ion dip.

As indicated in FIGS. 3A through 3D, the preliminary acid dip, taken alone, provides an improvement over the untreated control panels, but its effect is only nearly as significant as that of the metallic ion dip taken alone. Thus in FIG. 3A the contact resistance of the untreated panel increased by a factor of 11.5 after 50 hours of thermal cycling at 150° Centigrade. By significant contrast, the panels treated with the acid dip alone (phosphoric acid) with test points indicated by the designation "P", showed an increase in contact resistance after 50 hours by a factor of 2.5. The phosphoric acid has a concentration in the range from 10 to 100 percent. A desirable phosphoric acid concentration is 30 percent. The dipping time is approximately in the range from 10 to 30 seconds, with 30 seconds being particularly desirable. However, in the case of the metal ion dip (nickel) with test points indicated by "N", the increase in contact resistance was just by a factor of 1.5.

Similarly, in the case of efficiency, as before there was a significant reduction (75%) for the control sample. This is in contrast with a reduction of 30% for the acid cleansed samples, and the slight reduction of 10% for the metallic ion solution. The results of FIG. 3B are also confirmed by FIG. 3C where the fill factor for the control sample was reduced by 50% but the fill factor for the cleansing acid bath was reduced by 25%, while the nickel ion bath produced substantially no change, (about 5% reduction) even after 50 hours of thermal soaking at 150° C.

Figure 3C:
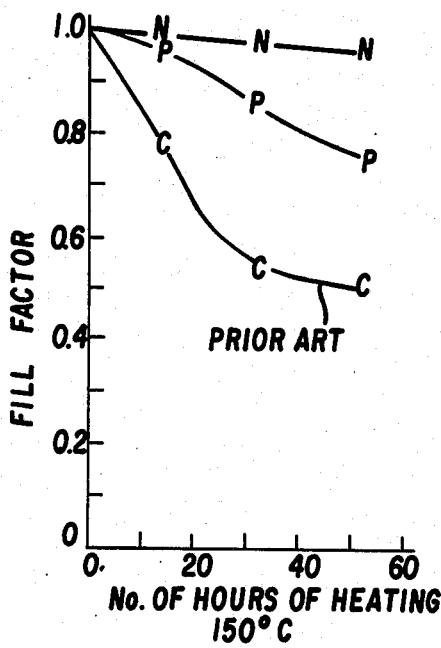
FIGS. 3A through 3D are graphs illustrating the effect of thermal cycling on untreated panels in comparison with variously treated panels in accordance with the invention.
Figure 3D:
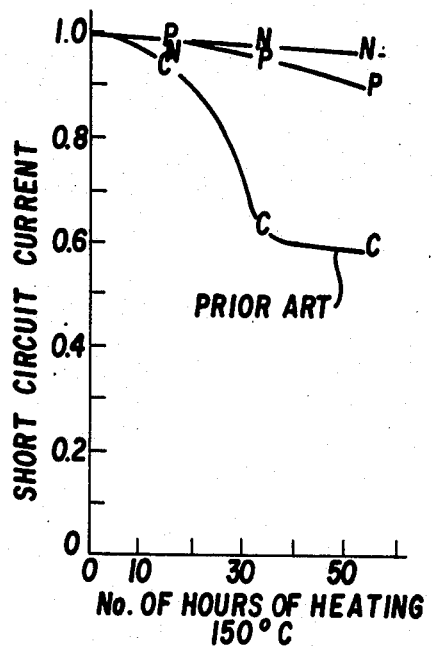
Figure 3A:
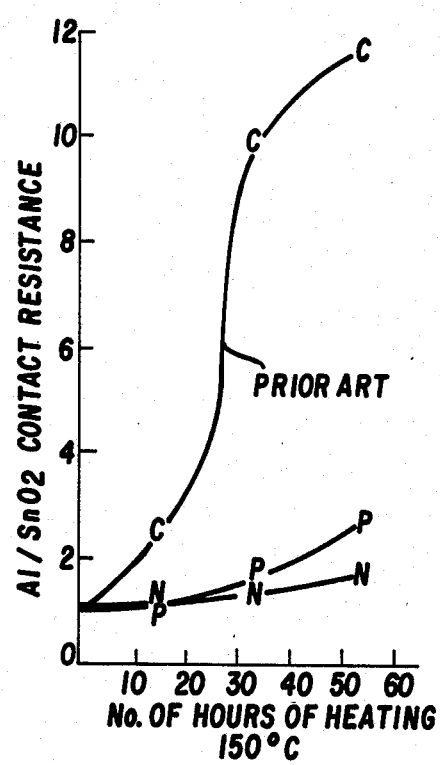
Figure 3B:
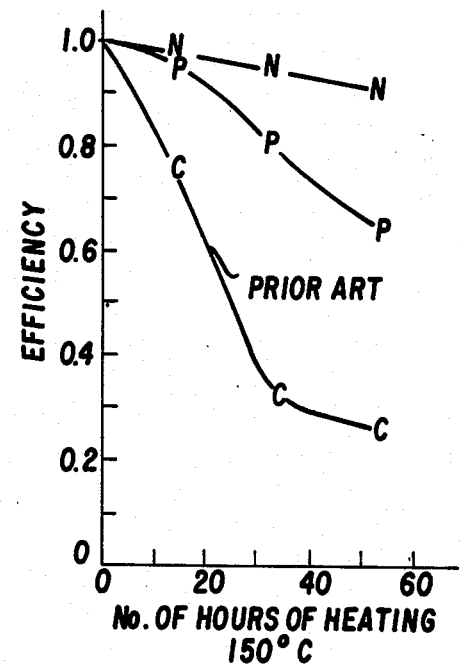

Finally, in the case of FIG. 3D the short circuit current sustained a significant reduction for the control sample but was virtually unchanged (or marginally reduced), for both the acid and the nickel baths, with the nickel (ion) bath producing virtually no change and being superior to the phosphoric acid cleansing bath taken alone.

The results summarized by FIGS. 3A through 3D refer to the treatment, and in the case of the control sample, the lack of treatment before aluminum metallization. After aluminum metallization all of the samples were heated at 150° Centigrade and the various parameters were measured as a function of time and plotted as normalized parameters.

It is seen from FIGS. 3A through 3D that the untreated panel degrades very rapidly but the metal ion and the acid dipped panels show superior stability in the face of thermal cycling and soaking at 150° C.

The better performance of the panels which are dipped in metallic ions alone may be attributable to the ability of the adsorbed metallic ion on the amorphous silicon and the exposed front electrode ($SnO_2$) to significantly limit interdiffusion of aluminum and silicon at the semiconductor metal interface, and the promotion of better contact between Al and $SnO_2$.

It is to be noted that the acid and metallic ion solution can be mixed so that only one dip is used instead of two separate dips. The boric acid in the metallic ion solution is desirable in acting as a buffer. In addition, other ions can be used, such as chromium and related metallic components.

The foregoing detailed description is for illustration only and it will be apparent that other adaptations of the invention will occur to those of ordinary skill in the art.

What is claimed is:

1. The method of stabilizing semiconductor devices with interconnections, which comprises the steps of:
    (a) providing the device with a first electrode which is exposed through an overlying layer of semiconductor;
    (b) dipping the device in said solution;
    (c) further dipping the device in a metallic ion solution; and
    (d) providing a further contact to the first contact.

2. The method of claim 1 wherein said device is rinsed after the acid dipping step.

3. The method of claim 1 wherein the acid dip contains phosphoric acid.

4. The method of claim 3 wherein the phosphoric acid has a concentration in the range from 10 to 100% and the dipping time is approximately in the range of 10 to 30 seconds.

5. The method of claim 4 wherein said phosphoric acid has a concentration of 30%.

6. The method of claim 4 wherein said dipping time is 30 seconds.

7. The method of claim 1 wherein the metallic ion solution contains nickel ions.

8. The method of claim 7 wherein the nickel ion solution is nickel sulfate and has a nickel ion concentration of about 11%.

9. The method of claim 1 wherein said device is rinsed after being dipped in the metallic ion solution.

10. The method of claim 9 wherein the device is dried with an isopropanol rinse after the second rinsing.

11. The method of claim 9 wherein the rinses are combined.

12. The method of claim 9 wherein the second rinsing is followed by metallic deposition to provide the final contacting element.

13. The method of claim 12 wherein said metallic deposition is by vacuum metallization.

14. The method of claim 1 wherein the metallic ion is chromium.

15. The method of claim 1 wherein the acid solution and the metallic ion solution are combined to provide a single bath.

16. The method of claim 1 wherein at least one of the solutions includes a surfactant, to promote contact between the surface and the ions.

17. The method of claim 16 wherein said surfactant is sodium lauryl sulfate.

18. A semiconductor device with interconnected electrodes, comprising a substrate;
a first electrode on said substrate;
an amorphous semiconductor on said first electrode;
metallic ions on said first electrode and said amorphous semiconductor;
and a second electrode on said semiconductor extending into contact with said first electrode at the interface of said first electrode and said metallic ions.

19. The apparatus of claim 18 wherein the metallic ions are nickel.

20. The apparatus of claim 18 wherein the metallic ions are chromium.

21. The apparatus of claim 20 wherein said apparatus is a solar cell panel comprising said substrate with a plurality of discrete transparent conductive first electrodes on the substrate;
said amorphous semiconductor comprising a layer on the transparent electrodes;
a plurality of second electrodes on said semiconductor layer and opposite the transparent electrodes;
and an interface between each separate transparent electrode and the opposite conducting electrode with metallic ions at said interface;
thereby to enhance the thermal stability of said device.

22. The device of claim 18 wherein said metallic ions are adsorbed upon said first electrode and said amorphous semiconductor to promote contact stability with said first electrode and interface stability between the amorphous semiconductor and the second electrode.

23. The method of stabilizing a semiconductor device with intraconnections wherein the device is a solar cell panel with a front electrode of conductive metal oxide underlying a layer of amorphous semiconductor, which comprises the steps of:
(a) providing said device with said front electrode which is exposed through said layer of amorphous semiconductor;
(b) dipping the device in acid solution;
(c) further dipping the device in a metallic ion solution; and
(d) providing a contact to said front electrode.

* * * * *